United States Patent [19]

Cline et al.

[11] 4,031,607

[45] June 28, 1977

[54] MINORITY CARRIER ISOLATION BARRIERS FOR SEMICONDUCTOR DEVICES

[75] Inventors: Harvey E. Cline; Thomas R. Anthony, both of Schenectady; Richard A. Kokosa, Skaneateles; E. Duane Wolley, Auburn, all of N.Y.

[73] Assignee: General Electric Company, Schenectady, N.Y.

[22] Filed: Apr. 29, 1976

[21] Appl. No.: 681,600

Related U.S. Application Data

[62] Division of Ser. No. 474,033, May 28, 1974, Pat. No. 3,988,762.

[52] U.S. Cl. .................................. 29/577; 29/580; 29/590; 148/171; 357/60; 357/64
[51] Int. Cl.² ......................................... B01J 17/00
[58] Field of Search ................... 29/578, 580, 577; 228/239, 240; 357/60, 64; 148/171

[56] References Cited

UNITED STATES PATENTS

| | | | |
|---|---|---|---|
| 2,813,048 | 11/1957 | Pfann | 228/240 |
| 2,967,344 | 1/1961 | Mueller | 29/578 |
| 3,266,127 | 8/1966 | Harding | 29/578 |
| 3,727,116 | 4/1973 | Thomas | 357/64 |
| 3,775,196 | 11/1973 | Wakamiya | 357/64 |

Primary Examiner—W. Tupman
Attorney, Agent, or Firm—Donald M. Winegar; Joseph T. Cohen; Jerome C. Squillaro

[57] ABSTRACT

A minority carrier isolation barrier in a body of semiconductor material is formed by the migration of a suitable metal-rich liquid zone of an impurity material through the semiconductor body. A thermal gradient zone melting process is practiced to produce a region of recrystallized semiconductor material of the body having solid solubility of an impurity therein to impart a level of minority carrier lifetime thereto which is different from that level of minority carrier lifetime of the body.

57 Claims, 7 Drawing Figures

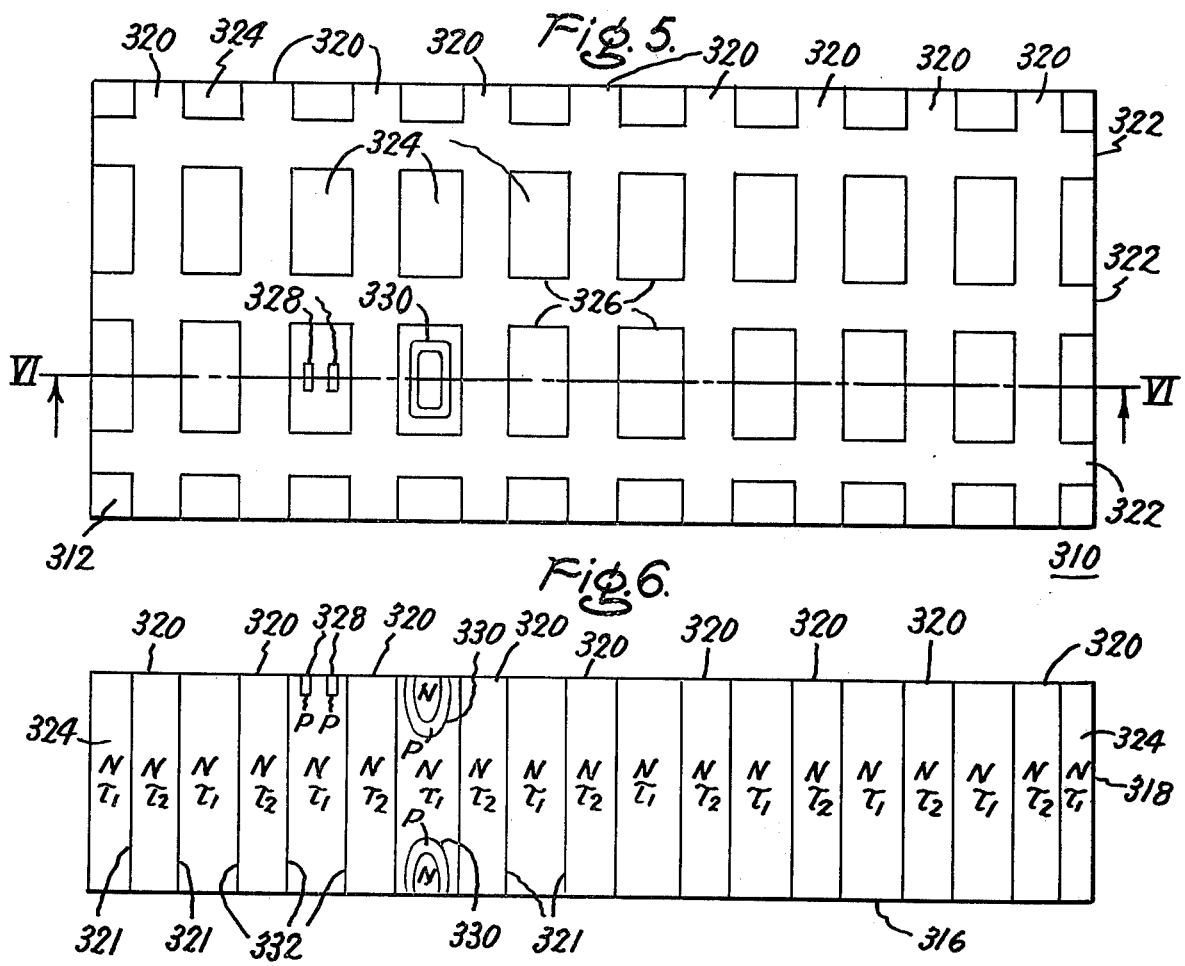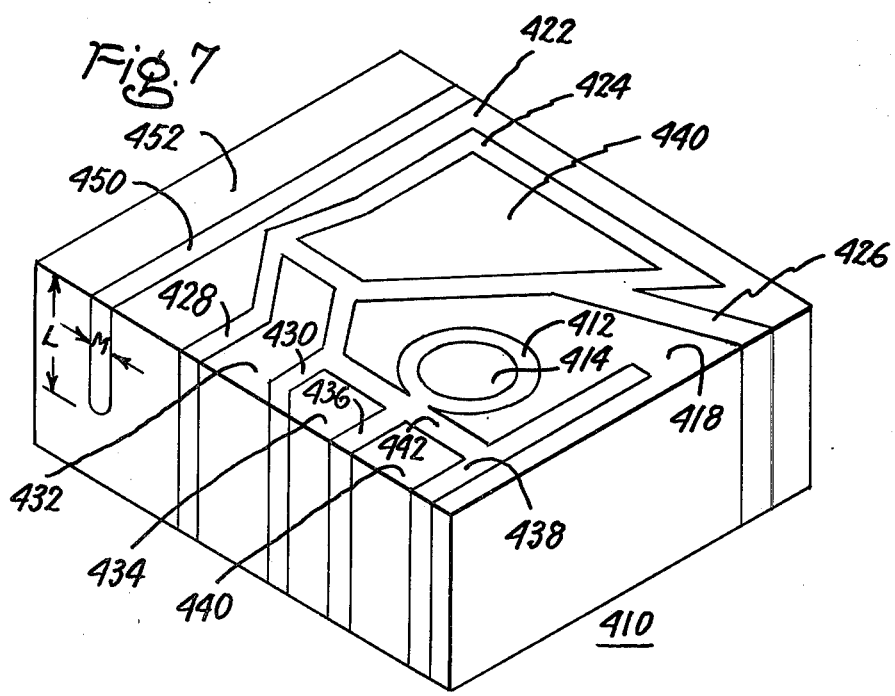

MINORITY CARRIER ISOLATION BARRIERS FOR SEMICONDUCTOR DEVICES

This is a division of application Ser. No. 474,033 filed May 28, 1974, now U.S. Pat. No 3,988,762.

BACKGROUND OF THE INVENTION

1. Field of the Invention

This invention relates to minority carrier isolation barriers in a body of semiconductor material and a method of making the same.

2. Background of the Invention

Many integrated circuits and related semiconductor devices currently depend on electrical isolation of one component from another. For obvious reasons, a common electrical isolation technique is to produce back-to-back P-N junctions between elements of the circuit which one desires electrically isolate. However, two main drawbacks of the technique are substrate leakage and the capacitance effects on the components and the circuit operation.

In many applications, where electrical isolation is currently used, minority carrier isolation rather than electrical isolation, therefore, is really the desired goal. Minority carrier isolation is presently obtained by electrically isolating two elements of a device or circuit which acts as a barrier to minority carriers and then electrically connecting the elements with a metal lead. Minority carrier isolation obtained in this manner requires all of the processing steps associated with electrical isolation as well as all of the processing steps required to join the electrically isolated regions with an electrically conductive metal bridge.

An object of this invention is to provide a new and improved minority carrier isolation barrier in a body of semiconductor material which overcomes the deficiencies of the prior art.

Another object of this invention is to provide a new and improved minority carrier isolation barrier in a body of semiconductor material which will increase manufacturing yields by reducing the number and the complexity of process steps presently involved in prior art minority-carrier-isolation technology.

Another object of this invention is to provide a new and improved minority carrier isolation barrier in a body of semiconductor material which optimizes the volume and surface area of the body of semiconductor material available for device and circuit fabrication.

A further object of this invention is to provide a new and improved minority carrier isolation barrier in a body of semiconductor material which does not simultaneously act as an electrical isolation barrier.

BRIEF DESCRIPTION OF THE INVENTION

In accordance with the teachings of this invention, there is provided a semiconductor device comprising a body of semiconductor material having two major surfaces forming respectively the top and bottom surfaces of the body. The body also has a peripheral side surface and a first level of minority carrier lifetime. At least one region of recrystallized semiconductor material having solid solubility of a material therein to impart a second level of minority carrier lifetime thereto is disposed within the body. The at least one region has at least one surface which is coextensive with at least one of the two major surfaces of the body and extends therefrom into the body a predetermined distance from that surface. The at least one region has a substantially constant level of minority carrier lifetime throughout. A minority carrier lifetime junction is formed by the abutting surfaces of each pair of regions of different levels of minority carrier lifetimes.

The at least one region may have a variety of geometrical configurations such for example as a planar region, torroidal shape and the like. A plurality of regions of second level of minority carrier lifetime may be utilized to divide a body of semiconductor material into an egg crate configuration in order to maximize the usage of the body of semiconductor material while minimizing the need for interconnecting leads between devices formed therein or thereon. The recrystallized region having a second level of minority carrier lifetime is particularly useful in solid state electronics wherein a diode and a four region switching device are integrated in a monolithic body to provide a bidirectional switch.

DESCRIPTION OF THE DRAWINGS

FIG. 5 is a top planar view of a semiconductor body embodying the minority carrier isolation barriers of this invention.

FIG. 6 is an elevation view in cross-section of the semiconductor body of FIG. 5 taken along the cutting planes VI—VI.

FIG. 7 is an isometric view of a body of semiconductor material processed in accordance with the teachings of this invention and embodying alternate configurations of minority carrier isolation barriers disposed therein.

DESCRIPTION OF THE INVENTION

Figure 1:
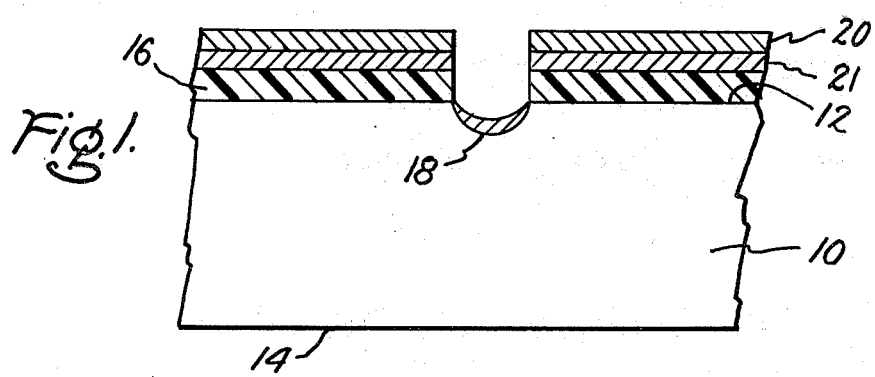
FIGS. 1 and 2 are elevation views in cross-section of a body of semiconductor material being processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a semiconductor compound of a Group II element and a Group VI element and a semiconductor compound of a Group III element and a Group V element. In order to describe the invention more fully, the body 10 is said to be of silicon semiconductor material.

The body 10 of silicon is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist 21, such, for example, as Kodak Metal Etch Resist, is disposed on the surface of the silicon oxide layer 16. The resist is dried by baking at a temperature of about 80° C for 30 minutes. A suitable mask of at least one geometric shape such for example, as a line of a predetermined width is disposed on the layer of photoresist and exposed to ultraviolet light. After exposure, the layer of photoresist is washed in xylene to open one or more windows in the mask where the at least one geometric shape is desired so as to be able to selectively etch the silicon oxide layer 16 exposed in the one or more windows.

Selective etching of the layer 16 of silicon oxide is accomplished with a buffered hydrofluoric acid solution ($NH_4F-HF$). The etching is continued until a second set of one or more windows corresponding to the one or more windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in a mixture of 1 part by volume hydrogen peroxide and 1 part by volume concentrated sulphuric acid.

Selective etching of the exposed surface area 12 of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of 5° C, the mixed acid solution selectively etches the silicon of the body 10 at a rate of approximately 2 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the metal "wire" to be migrated through the body 10. Etching for approximately 10 minutes at a temperature of 5° C will result in a trough 18 of from 20 to 25 microns in depth for a window width of from 10 to 500 microns. The etched body 10 is rinsed in distilled water and blown dry. Preferably, a gas such, for example, as freon, argon and the like, is suitable for drying the processed body 10.

The processed body 10 is disposed in a metal evaporation chamber. A metal layer 20 comprising a metal selected from the group consisting of gold, silver, platinum, iron, nickel and copper, is deposited on the remaining portions of the layer 21 of photoresist and on the exposed silicon in the trough 18. Gold, silver and platinum are suitable materials for controlling the minority carrier lifetime of the recrystallized region 22. The minority carrier lifetime controlling metal in the trough 18 is the metal "wire" to be migrated through the body 10. The minority carrier lifetime controlling metal of the layer 20 is either substantially pure in itself or contains one or more other materials such, for example, as tin and lead which are not doping materials which would affect the type conductivity of the material of the body 10 through which it migrates. Materials such as tin and lead reduce the concentration of the gold, silver, or platinum in the recrystallized region to be formed. The thickness of the layer 20 is approximately equal to the depth of the trough 18. Therefore, if the trough 18 is 20 microns deep, the layer 20 is approximately 20 microns in thickness. Prior to migrating the metal "wire" in the trough 18 through the body of silicon 10, the excess metal of the layer 20 is removed by chemically lifting off the photoresist layer 21 from the silicon oxide layer 16 with photoresist remover.

Depending upon the type of conductivity of the material of the body 10, a material such, for example, as aluminum, gallium, indium and antimony may be co-migrated with the other materials to alter the resistivity of the recrystallized material of the body 10 without forming a region of opposite type conductivity and associated P-N junctions.

It has been discovered that the vapor deposition of the layer 20 of metal should be performed at a pressure of approximately $1 \times 10^{-5}$ torr but not greater than $5 \times 10^{-5}$ torr. When the pressure is greater than $5 \times 10^{-5}$ torr, we have found that metal deposited in the trough 18 does not penetrate into the silicon and migrate through the body 10. It is believed that the layer of metal is saturated with oxygen which prevents penetration of a thin layer of silicon oxide, formed when the silicon surface is exposed to air, by the gold and gold bearing metals and thus, a good wetting of the contiguous surfaces of silicon. The initial melting and alloying of metal of the "wire" with silicon required for migration is not obtained because of the inability of the metal "wire" atoms to diffuse into the silicon interface. In a like manner, metal deposited by sputtering is not as desirable because sputtered metal appears to be saturated with oxygen. The preferred methods of depositing metal on the silicon body 10 are by the electron beam method and the like wherein little, if any, oxygen can be trapped in the metal.

The processed body 10 is placed in a migration apparatus, not shown, and the metal wire in the trough 18 is migrated through the body 10 by a thermal gradient zone melting process. A thermal gradient of approximately 50° C to 200° C per centimeter between the bottom surface 14, which is the hot face, and the surface 12, which is the cold face, has been discovered to be appropriate for an average temperature of the body 10 from 400° C to 1350° C. The process is practiced for a sufficient length of time to migrate all the metal wires through the body 10. For example, for gold wires of 20 microns thickness, a thermal gradient of 50° C/cm, a temperature of the body 10 of 450° C, and a pressure of $1 \times 10^{-5}$ torr, a furnance time of less than 24 hours is required to migrate the wire through a silicon body 10 of 1 centimeter thickness.

The temperature gradient zone melting process and apparatus is not a part of this invention. For a more thorough understanding of the temperature gradient zone melting process employed in this invention, and for a more thorough description of the apparatus employed for the process, one is directed to our copending applications entitled Method of Making Deep Diode Devices, Ser. No. 411,150 and now U.S. Pat. No. 3,907,736; High Velocity Thermal Migration Method of Making Deep Diodes, Ser. No. 411,021 and now U.S. Pat. No. 3,910,801; Deep Diode Devices and Method of Apparatus, Ser. No. 411,001, now abandoned in favor of a Continuation, Ser. No. 552,154; High Velocity Thermomigration Method of Making Deep Diodes, Ser. No. 411,015 and now U.S. Pat. No. 3,898,106; Deep Diode Device and Method, Ser. No. 411,009 and now U.S. Pat. No. 3,902,925; and Stabilized Droplet Method of Making Deep Diodes Having Uniform Electrical Properties, Ser. No. 411,008 and now U.S. Pat. No. 3,899,361, and assigned to the same assignee of this invention.

Figure 2:
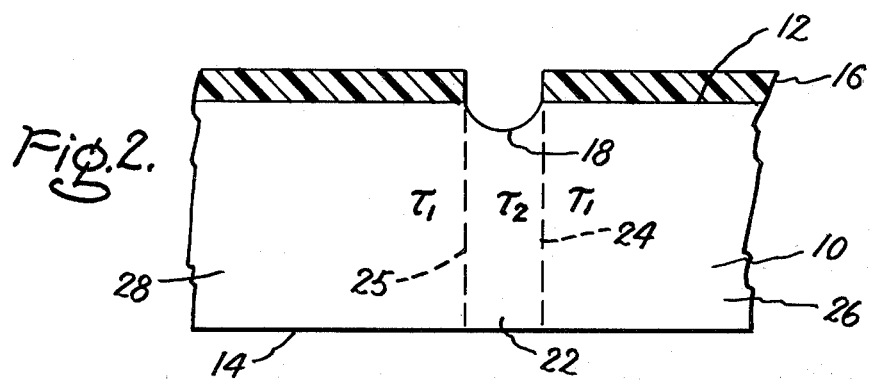

Upon completion of the temperature gradient zone melting process, the gold, silver or platinum bearing wire which has migrated through the body 10 onto the surface 14 is removed by selective etching or grinding. The resulting processed body 10 is as shown in FIG. 2. The thermal migration of the metal wire in the trough 18 through the body 10 produces a body 10 having a region 22 of recrystallized material of the body 10 having solid solubility of the material comprising the metal "wire" therein. The metal retained in the recrystallized region is the maximum allowed by the crystalline structure of the material through which it has migrated, the temperature of the process and the materials involved. It is not semi-conductor material which has eutectic material therein, and it is not an alloy of the impurity and the semi-conductor materials. The region 22 has a constant uniform level of impurity concentration throughout the entire planar region and therefore substantially a constant uniform level of minority carrier lifetime throughout the region. The thickness of the region 22 is substantially constant for the entire region. The peripheral surface of each planar region 22 comprises in part the top surface 12, the bottom surface 14 and the peripheral side surfaces of the body 10. The resulting structure of the processed body 10 comprises regions 26 and 28 of silicon semiconductor material of a high minortiy carrier lifetime $\tau_1$ and region 22 of recrystallized silicon semi-conductor material having solid solubility of a minority carrier lifetime controlling metal such, for example, as gold, silver, iron, nickel, copper or platinum therein to impart the desired low level of minority carrier lifetime $\tau_2$. An interface or minority carrier lifetime, MCL, junction 24 and 25 is formed between each pair of the respective regions 22 and 26 and 22 and 28 of different levels of minority carrier lifetime material. At each MCL junction the minority carrier lifetime of the semiconductor material changes abruptly from $\tau_1$ to $\tau_2$ while the rest of the semi-conductor properties such as the crystallographic orientation resistivity and type of conductivity remain the same. $\tau_2$ is preferably much less than $t_1$ such, for example, as a difference of 2 to 3 orders of magnitude.

The minority carrier lifetime (MCL) junctions 24 and 25 are well defined and show an abrupt transition from one region of minority carrier lifetime $t_1$ to the next adjacent region of differing minority carrier lifetime $t_2$. Because of the relatively high solid state diffusion coefficient of minority carrier lifetime killers such, for example, as gold, iron, nickel and copper, region 22 should be produced at a temperature generally less than 800° C. After the fabrication of basic operational devices either within or on the surface of the regions 26 and 28 of the body 10.

The region 22 besides offering excellent minority isolation between mutually adjacent regions 26 and 28, has several distinct advantages over prior art minority carrier isolation regions. One as mentioned previously is that the region is substantially of constant uniformity in width and has a substantially uniform impurity concentration throughout its entire width. In addition, region 22 does not electrically isolate devices in the regions 26 and 28 from each other. Morever, region 22 is processed preferably at a temperature at which solid state diffusion is inoperative so that any devices previously fabricated within or on high lifetime regions of the processed body 10 are left unaffected and unchanged by the thermal gradient zone melting process which is employed to produce the region 22.

However, should it be desirable to lower the minority carrier lifetime in the regions 26 and 28 for the proper operation of devices that are fabricated therein or thereon, then a post migration heat treatment may be practiced to introduce some of the lifetime killing impurities contained in the region 22 by diffusion into the mutually adjacent regions 26 and 28.

The minority carrier lifetime junctions or barriers formed by region 22 are also desirable in the semiconductor art in that it permits the maximum use of the volume of the body 10 for the manufacturer of solid state electrical devices. In addition, because region 22 does not electrically isolate regions 26 and 28 from one another, this new and improved minority carrier lifetime junction or barrier formed by the region 22 maximizes the surface area of the processed body 10 which can be utilized for functional electrical devices since electrical leads are not required to electrically connect a device in the region 26 with another device manufactured in the region 28 of the body 10.

Figure 3:
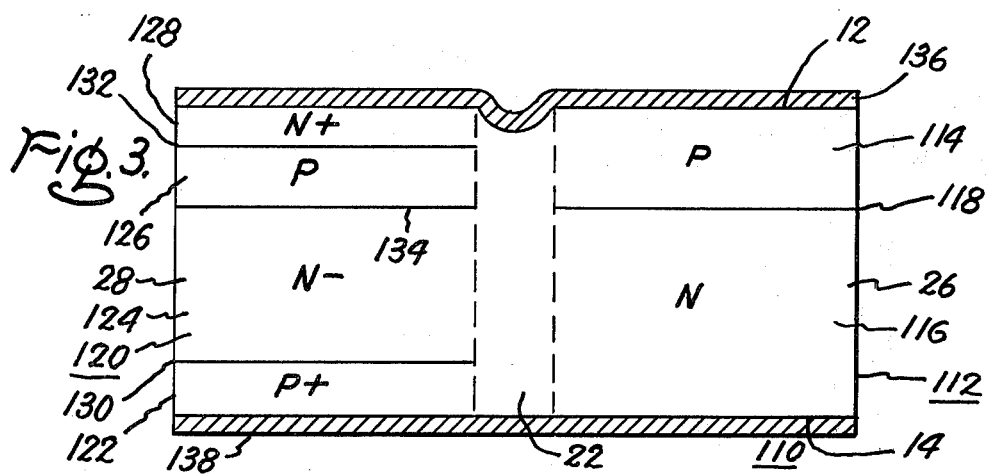
FIG. 3 is an elevation view in cross-section of a semiconductor device made in accordance with the teachings of this invention.

In particular, with reference to FIG. 3, a bidirectional switching device 110 may be fabricated from the processed body 10 of FIG. 2. Employing semiconductor processing techniques well known to those skilled in the art, one may form a diode in the region 26 wherein the region is divided into one region 114 of P-type conductivity having a surface which is coextensive with the surface 12 of the body 10, and an N-type region 116 which has a surface which is coextensive with the surface 14 of the body 10. A P-N junction 118 is formed at the interface of the two regions 114 and 116 and is substantially parallel to the two major opposed surfaces 12 and 14. A four region semiconductor switching device is formed in the region 26 of the processed body 10. The four region switching device comprises a first region 122 of such, for example, $P^+$ type conductivity and a region 124 of N-type conductivity, a region 126 of P-type conductivity and a region 128 of $N^+$ type conductivity. The region 122 of $P^+$ type conductivity has a surface which is coextensive with the surface 14 of the body 10. The region 128 of $N^+$ type conductivity has a surface which is coextensive with the surface 12 of the body 10. P-N junctions 130, 132 and 134 are formed by the interfaces of the respective pairs of regions of alternate type conductivity 122 and 124, 124 and 126, and 126 and 128. The minority carrier lifetime control region 22 is disposed between the diode and the semiconductor switch. A layer 136 of an electrically conductive metal such, for example, as aluminum, silver or gold, is disposed on the surface 12 of the body 10 including the surfaces of the regions 22, 114 and 128 which are coextensive therewith. A layer of 138 of electrically conductive metal is disposed on the surface 14 of the body 10 and is in electrically conductive relationship with the region 116, 22 and 122. The solid state device 110, as shown in FIG. 3, is a reverse conducting thyristor equivalent to a thyristor and antiparallel diode. The diode can be turned off by voltage reversal and the thyristor will block voltage quickly since the region 22 prevents carriers from either one of the devices from being able to migrate to the other device when they are functioning. The same techniques can be used to isolate the two thyristor sections of a bidirectional thyristor.

Figure 4:
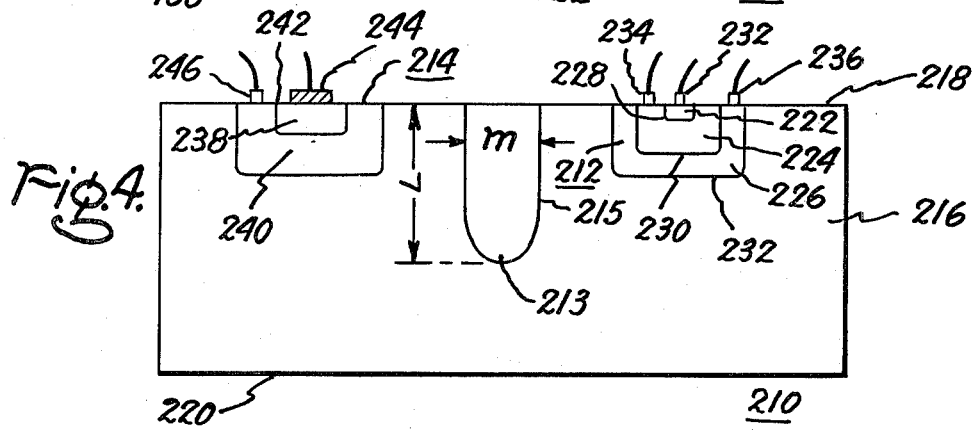
FIG. 4 is an elevation view in cross-section of an alternate embodiment of this invention.

Referring now to FIG. 4, there is shown an alternate embodiment of this invention in a semiconductor device 210 which is a planar device embodying a transistor 212 and a diode 214 separated from each other by a minority carrier lifetime junction or barrier. The device comprises a body 216 of a semiconductor material selected from the group described as comprising the body 10 of FIGS. 1, 2 and 3, and has major opposed surfaces 218 and 220 which form respectively the top and bottom surfaces thereof. The body 216 has a first type conductivity and a selected resistivity. The planar transistor 212 comprises regions 224 of first type conductivity and regions 222 and 226 of second type conductivity. P-N junctions 228, 230 and 232 are formed at the interfaces of the abutting regions of opposite type conductivity, 222 and 224, 224 and 226, 226 and 216. Electrical contacts 232, 234 and 236 are electrically connected to respective regions 222, 224 and 226. The planar diode 214 comprises region 238 of first type conductivity and regions 240 of second type conductivity and a P-N junction 242 formed at the interface of the abutting regions 238 and 240 of opposite type conductivity. Electrical contacts 244 and 246 are electrically connected to the respective regions 238 and 240.

A minority carrier lifetime junction 215 is formed between the minority carrier region 213 and the material of the body 216. The region 213 of low minority carrier lifetime serves as an effective minority carrier barrier between the near surface zones of the region 216 immediately adjacent thereto and the devices 212 and 214 which are formed therein, the minority carrier lifetime of the region 216 being greater than that of the region 213. The concentration of minority carriers decreases as exponential negative $(X/\tau)$ where $\tau$ is the minority carrier lifetime and X is the distance from the source of minority carriers. If the source of minority carriers comes from respective surface devices 212 and 214, the concentration of minority carriers arriving from each of the devices 212 and 214 will be decreased by a factor exponential $-(2L+M)/\tau$ by formation of the "finger" type minority carrier barrier region 213 in the body 216. For a complete description of how the region 213 is formed in the body 216, attention is drawn to the copending application of Thomas R. Anthony and Harvey E. Cline, entitled "Deep Finger Diodes", which is copending with this application as of this date and is assigned to the same assignee as this invention and has the Ser. No. 411,002, the same being abandoned in favor of continuation Ser. No. 559,262, and now U.S. Pat. No. 3,988,770. The method taught in the above-referenced patent application may be employed to make the region 213 if a dopant controlling minority carrier lifetime such, for example, as gold and the like, as previously described heretofore in this patent application, is substituted for the dopant described in the copending application, Ser. No. 411,002. In summary, the device 210 thus illustrates the minority carrier barriers need not always pass completely through a semiconductor body.

Referring now to FIGS. 5 and 6, there is shown a semiconductor device 310 comprising a body 312 of single crystal semiconductor material having a selected resistivity and a first type conductivity. The semiconductor material comprising the body 312 may be silicon, germanium, silicon carbide, gallium arsenide, a compound of a Group II element and a Group VI element and a compound of a Group III element and a Group V element. The body 312 has two major opposed surfaces 314 and 316, which define the top and bottom surfaces thereof respectively, and a peripheral side surface 318. In order to describe the invention in more detail, the body 312 will be described as being of silicon semiconductor material.

A plurality of first spaced planar regions 320 of a second selected level of minority carrier lifetime are disposed in the body 312 substantially parallel to each other. Preferably, each of the regions 320 is oriented substantially perpendicular to the top and bottom surfaces 314 and 316, respectively, and the peripheral side surface 318. Each of the regions 320 has a peripheral side surface which is coextensive with the respective surfaces 314, 316 and 318 of the body 312. An interface or "minority carrier lifetime junction" (hereinafter referred to as MCL junction) 321 is formed by the contiguous surfaces of the material of each region 320 and of body 312. At each MCL junction 321, the minority carrier lifetime of the semiconductor material changes abruptly from $\tau_1$ to $\tau_2$ while the rest of the semiconductor properties such as crystallographic orientation, resistivity, and type of conductivity remain the same. $\tau_2$ is preferably much less than $\tau_1$ such, for example, as an order of three magnitudes.

A plurality of second spaced planar regions 322 of a third selected level of minority carrier lifetime are disposed in the body 312 substantially parallel to each other. Preferably, each of the regions 322 is oriented substantially perpendicular to the respective top and bottom surfaces 314 and 316 and to the side surface 318. In addition, each of the regions 322 is preferably perpendicular to, and intersects, selected ones of the plurality of first spaced planar regions 320. Each of the second planar regions 322 has a peripheral side surface which is coextensive with the surfaces 314, 316 and 318 of the body 312. A MCL junction 326 is formed by the contiguous surfaces of the material of each region 322 and the immediately adjacent material of the body 312. The intersecting planar regions 320 and 322 define an egg crate configuration which divides the body 312 into a plurality of third regions 324 having the first selective level of minority carrier lifetime.

Preferably, each of the regions 320 and 322 are of the same selective level of minority carrier lifetime, the minority carrier lifetime being substantially, of the order of three magnitudes, smaller than the minority carrier lifetime of body 312 and regions 324. Other than for differences in the levels of the minority carrier lifetime, the semiconductor properties and crystal structure of body 312, region 324, region 322 and region 320 are essentially the same. However, it may be desirable that regions 320 and 322 also have resistivities that differ from region 324.

Temperature gradient zone melting is the preferred process means for forming the regions 320 and 322 in the body 312. The process is described heretofore in the patent application and in the referenced copending patent applications of Anthony and Cline. The material of the planar region 320 and 322 comprises recrystallized semiconductor material of the body 312 having a concentration of an impurity constituent which imparts the selected level of minority carrier lifetime thereto. It is recrystallized material with solid solubility of the impurity metal. Each of the planar regions 320 and 322 has a substantially uniform minority carrier lifetime throughout its entire region. The substantial uniform minority carrier lifetime results from the fact that the slope of the solid solubility of metal curve is small for the temperature range practiced. The width of each of the regions 320 and 322 is substantially constant over the entire region and is determined by whatever photomasking geometry is used to define the regions 320 and 322.

All of the regions 320 are formed simultaneously and all of the regions 322 are formed simultaneously, either by individual processing or by employing the proper planar orientation for the material of the body 312 along with line directions and axis of thermal migration, all regions 320 and 322 may be formed in one process.

The resulting structure of the device 310 is a body 312 divided into plurality of regions 324 of silicon semiconductor material of a high minority carrier lifetime $\tau_1$, and regions 320 and 322 of a suitably doped with a minority carrier lifetime controlling metal, such for example, as gold, silver, platinum, and the like recrystallized silicon with the desired low level of minority carrier lifetime $\tau_2$.

For a more complete description of how the planar regions 320 and 322 are formed in the body 12, attention is drawn to the copending application of Anthony and Cline entitled "Method of Making Isolation Grids in Bodies of Semiconductor Material", Ser. No. 411,022, and now U.S. Pat. No. 3,904,442, assigned to the same assignee of this invention.

Minority carrier lifetime, MCL, junctions 321 and 326 are well defined and show an abrupt transition from one region of minority carrier lifetime to the next adjacent region of differing minority carrier lifetime. Because of the relatively high diffusion solid state diffusion coefficient of minority carrier lifetime killers such as gold, iron, nickel and copper, the planar regions 320 and 322 should be produced at temperatures generally less than 800° C after the fabrication of the basic operational devices 328 and 330 fabricated within or on the surface of the regions 324 of the body 312. The devices 328 and 330 may be planar semiconductor devices formed in mutually adjacent regions 324 or thyristor type devices 330 formed in mutually adjacent regions 324 or other types of semiconductor devices where the minority carriers produced during the operation of one device could detrimentally affect the operation of a mutually adjacent device. For example, a semiconductor on-off trigger for a power thyristor if both the trigger and thyristor are fabricated in the same semiconductor body. The minority carrier lifetime barrier achieved by our invention enables one to associate one or more such devices with one or more of the plurality of regions 324 of the first type minority carrier lifetime while still allowing electrical contact between the devices through the semiconductor body 312 and while still guaranteeing the operational integrity of the respective devices.

The spaced planar regions 320 and 322 besides offering excellent minority carrier isolation between mutually adjacent regions 324 have several distinct advantages over prior art minority carrier isolation regions. Each of the regions 320 and 322 have a substantially constant uniform width and a substantially uniform impurity concentration for its entire length.

In addition, regions 320 and 322 do not electrically isolate devices on the regions 324 from each other. Moreover, regions 320 and 322 are processed at temperatures at which solid state diffusion is inoperative so that any devices previously fabricated on high lifetime regions 324 of body 312 are left unaffected and unchanged by the thermal gradient zone melting process used to produce regions 320 and 322.

However, it should be desirable to lower the minority carrier lifetime in region 324 for the proper operation of devices 328 and 330, then a post migration heat treatment may be practiced to allow some of the lifetime killing impurities contained in regions 320 and 322 to diffuse into regions 324.

The minority carrier barriers formed by regions 320 and 322 are also desirable in that they maximize the volume of the body 312 which can be utilized for functional electrical devices since individual electrical leads are not required to electrically connect the one specific region 324 with another specific region 324.

The MCL planar barriers 320 and 322 shown in FIGS. 5 and 6 are a convenient and simple geometry of minority carrier isolation barriers. However, such a geometry for minority carrier barriers is not the only configuration that may be useful. With reference to FIG. 7, a semiconductor device 410 embodying a plurality of minority carrier isolation barriers, which are made in accordance with the teachings of this invention are shown. The minority carrier isolation barrier may be toroidal as indicated by region 412 of low minority carrier lifetime which isolates a region 414 of first type high minority carrier lifetime from a region 418 of first type high minority carrier lifetime. Regions 420 and 422 of first type carrier lifetime are mutually isolated from minority carriers of each other by a region 424 of second type and low minority carrier lifetime. Regions 426 of a second type and low minority carrier lifetime isolate selected portions of regions 422 and a region of 418 of first type and high minority carrier lifetime from each other's minority carriers. Regions 428 and 430 of second type and low minority carrier lifetime isolate a region 432 of first type and high minority carrier lifetime from a selected portion of the region 422 and a region 434, both of a first type and high carrier lifetime. Regions 436 and 438 of a second type and low minority carrier lifetime isolate a region 440 of first type and high minority lifetime from a selected portion of the region 418. Region 442 of second type and low minority carrier lifetime is integral with regions 412, 424, 430, 436 and 438 and mutually isolates minority carriers of selected portions of region 418 from regions 432, 434 and 440 and 412 from 440.

Region 450 of second type and low minority carrier lifetime serves as an effective minority carrier barrier between near surface zones of regions 422 and 452 of high carrier lifetime. The concentration of minority carriers decreases as exponential - $(X/\tau)$ where $\tau$ is the minority carrier lifetime and X is the distance from the source of minority carriers. If the sources of minority carriers come from respective surface devices on regions 452 and 422, the concentration of minority carriers arriving from each of the devices will be decreased by a factor exponential $(2L+M)/\tau$ by putting in the "finger" type minority carrier barrier 450. For a complete description of how the region 450 is formed in body 410, attention is drawn to the copending application of Thomas R. Anthony and Harvey E. Cline entitled "Deep Finger Diodes" filed on the same day as this invention, assigned to the same assignee as this invention and having the Ser. No 411,002, the same being abandoned in favor of continuation Ser. No. 559,262, and now U.S. Pat. No. 3,988,770. The method of this application may be employed to make region 450 if a dopant controlling minority carrier lifetime such as gold is substituted for the dopant described in that application controlling the production of a selected type of conductivity. In summary, device 410 thus illustrates that minority carrier barriers need not always be perpendicular or parallel to each other or to always pass completely through a semiconductor body or to be of any specific geometric shape.

It has been discovered that when the body 12 is of silicon, germanium, silicon carbide, gallium arsenide semiconductor material and the like, the migration of metal wires is preferably practiced in accordance with the planar orientation, migration directions, stable wire directions and stable wire sizes of the following Table:

Table

| Wafer Plane | Migration Direction | Stable Wire Directions | Stable Wire Sizes |
|---|---|---|---|
| (100) | $<100>$ | $<011>$* | $<100$ microns |
|  |  | $<0\bar{1}1>$* | $<100$ microns |
| (110) | $<110>$ | $<1\bar{1}0>$* | $<150$ microns |
| (111) | $<111>$ | $^+$a) $<01\bar{1}>$ |  |
|  |  | $<10\bar{1}>$ | $<500$ microns |
|  |  | $<1\bar{1}0>$ |  |
|  |  | b) $<11\bar{2}>$* |  |
|  |  | $<\bar{2}11>$* | $<500$ microns |
|  |  | $<1\bar{2}1>$* |  |
|  |  | c) Any other Direction in (111) plane* | $<500$ microns |

*The stability of the migrating wire is sensitive to the alignment of the thermal gradient with the $<100>$, $<110>$ and $<111>$ axis, respectively.
$^+$Group a is more stable than group b which is more stable than group c.

Although the invention has been described relative to practicing thermal gradient zone melting in a negative atmosphere, it has been discovered that the thermal gradient zone melting process may be practiced in an inert gaseous atmosphere of hydrogen, helium, argon and the like, in a furnace having a positive atmosphere. In addition, when the body of semiconductor material is a thin wafer of the order of 15 mils thickness wires with sizes and crystallographic directions that would normally cause instability can be successfully migrated through the semiconductor wafer before the wire has time enough to become unstable and to break up into droplets.

We claim as our invention:

1. A process for forming a region of a selected minority carrier lifetime in a body of semiconductor material comprising the steps of:
   a. selecting a body of single crystal semiconductor material having two major opposed surfaces comprising, respectively, the top and bottom surfaces thereof, a selected level of resistivity, a selected type conductivity, and a preferred planar crystal structure orientation of at least one of the major opposed surfaces, the planar crystal structure orientation is one selected from the group consisting of (111), (100) and (110);
   b. orienting the body so that the vertical axis of the body is substantially aligned with a first axis of the crystal structure which is substantially perpendicular to the at least one major opposed surface having the preferred planar crystal structure orientation;
   c. disposing at least one metal wire of selected metal composition comprising at least one material suitable for controlling the minority carrier lifetime in a body of semiconductor material on the surface having a preferred planar orientation, each metal wire having a preferred stable wire direction which is dependent upon the planar orientation of the major surface;
   d. heating the body and the at least one metal wire to a temperature sufficient to form a melt of metal-rich semiconductor material on the major surface of the body;
   e. establishing a thermal gradient substantially parallel with the vertical axis of the body and the first crystal axis of the material of the body;
   f. thermal migrating each melt into the body a predetermined distance from the one major surface parallel with the first crystal axis in the direction of the higher temperature of the thermal gradient to form a region of recrystallized semiconductor material of the body having solid solubility of the metal of the melt, as determined by the temperature of migration, and a level of minority carrier lifetime which is different from that minority carrier level of the material of the body.

2. The process of claim 3 including practicing the following additional process step prior to the disposing at least one metal wire on the surface of
   selectively etching a selective portion of the major surface of the body to form a depression therein into which the metal of the melt is deposited.

3. The process of claim 2 wherein the metal of the melt is vapor deposited.

4. The process of claim 2 wherein the metal comprises at least one metal selected from the group consisting of gold, silicon, platinum and copper.

5. The process of claim 1 wherein thermal migrating of each melt is practiced until the region which is formed thereby extends between, and terminates in, the two major opposed surfaces.

6. The process of claim 2 wherein thermal migrating of each melt is practiced until the region which is formed thereby extends between, and terminates in, the two major opposed surfaces.

7. The process of claim 3 wherein thermal migrating of each melt is practiced until the region which is formed thereby extends between, and terminates in, the two major opposed surfaces.

8. The process of claim 4 wherein thermal migrating of each melt is practiced until the region which is formed thereby extends between, and terminates in, the two major opposed surfaces.

9. The process of claim 5 and further including the additional process step prior to the disposing at least one metal wire on the surface of
   forming at least two semiconductor devices in mutually adjacent regions of the body, each device having at least one p-n junction, and wherein
   the region of recrystallized semiconductor material is disposed between and in abutting contact with each of the at least two semiconductor devices.

10. The process of claim 2 and further including the additional process step prior to the selected etching of the major surface of
    forming at least two semiconductor devices in mutually adjacent regions of the body, each device having at least one p-n junction, and wherein
    the region of recrystallized semiconductor material is disposed between and in abutting contact with each of the at least two semiconductor devices.

11. The process of claim 4 and further including the additional process step prior to the selected etching of the major surface of forming at least two semiconductor devices in mutually adjacent regions of the body, each device having at least one p-n junction, and wherein the region of recrystallized semiconductor material is disposed between and in abutting contact with each of the at least two semiconductor devices.

12. The process of claim 1 and including practicing the process steps prior to the disposing at least one metal wire on the surface of masking the body of semiconductor material with at least one material which is of a photoresist type to provide selected exposed surface areas of the body, depositing the at least one metal wire as a layer of metal on the photoresist type masking layer and the selected exposed surface areas of the body, and heating the metal coated body to remove all of the metal layer except for that portion deposited on the selected surfaces of the body by burning off the photoresist type material layer to lift the metal layer disposed thereon away from the body.

13. The process of claim 1 wherein thermal migrating of each melt is practiced at a temperature slightly above the metal-semiconductor material eutectic temperature in order to minimize the lateral diffusion of the dissolved metal material which imparts the minority carrier lifetime control to the recrystallized semiconductor material.

14. The process of claim 1 wherein the planar crystal structure orientation is (111), and the first crystal axis is <111>.

15. The process of claim 14 wherein the metal wire comprises at least one metal selected from the group consisting of gold, silicon, platinum and copper.

16. The process of claim 15 wherein the preferred stable wire direction is at least one selected from the group consisting of $<01\bar{1}>$, $<10\bar{1}>$, $<1\bar{1}0>$, $<11\bar{2}>$, $<\bar{2}11>$ and $<1\bar{2}1>$.

17. The process of claim 15 wherein the semiconductor material is silicon.

18. The process of claim 16 wherein the semiconductor material is silicon.

19. The process of claim 3 wherein the planar crystal structure orientation is (100), the first crystal axis is <100>, and the preferred stable wire direction is at least one selected from the group consisting of $<0\bar{1}1>$ and $<0\bar{1}\bar{1}>$.

20. The process of claim 19 wherein the metal wire comprises at least one metal selected from the group consisting of gold, silicon, platinum and copper.

21. The process of claim 20 wherein the semiconductor material is silicon.

22. The process of claim 1 wherein the planar crystal structure orientation is (110), the first crystal axis is <110>, and the preferred stable wire direction is $<1\bar{1}0>$.

23. The process of claim 22 wherein the metal wire comprises at least one metal selected from the group consisting of gold, silicon, platinum and copper.

24. The process of claim 23 wherein the semiconductor material is silicon.

25. The process of claim 3 wherein the planar crystal structure orientation is (111) and the first crystal axis is <111>.

26. The process of claim 25 wherein the metal wire comprises at least one metal selected from the group consisting of gold, silicon, platinum and copper.

27. The process of claim 26 wherein the preferred stable wire direction is at least one selected from the group consisting of $<01\bar{1}>$, $<10\bar{1}>$, $<1\bar{1}0>$, $<11\bar{2}>$, $<\bar{2}11>$ and $<1\bar{2}1>$.

28. The process of claim 26 wherein the semiconductor material is silicon.

29. The process of claim 27 wherein the semiconductor material is silicon.

30. The process of claim 3 wherein the planar crystal structure orientation is (100), the first crystal axis is <100>, and the preferred stable wire direction is at least one selected from the group consisting of <011> and $<0\bar{1}1>$.

31. The process of claim 30 wherein the metal wire comprises at least one metal selected from the group consisting of gold, silicon, platinum and copper.

32. The process of claim 31 wherein the semiconductor material is silicon.

33. The process of claim 3 wherein the planar crystal structure orientation is (110), the first crystal axis is <110>, and the preferred stable wire direction is $<1\bar{1}0>$.

34. The process of claim 33 wherein the metal wire comprises at least one metal selected from the group consisting of gold, silicon, platinum and copper.

35. The process of claim 34 wherein the semiconductor material is silicon.

36. The process of claim 5 wherein the planar crystal structure orientation is (111), and the first crystal axis is <111>.

37. The process of claim 36 wherein the metal wire comprises at least one metal selected from the group consisting of gold, silicon, platinum and copper.

38. The process of claim 37 wherein the preferred stable wire direction is at least one selected from the group consisting of $<01\bar{1}>$, $<10\bar{1}>$, $<1\bar{1}0>$, $<11\bar{2}>$, $<\bar{2}11>$ and $<1\bar{2}1>$.

39. The process of claim 37 wherein the semiconductor material is silicon.

40. The process of claim 38 wherein the semiconductor is silicon.

41. The process of claim 5 wherein the planar crystal structure orientation is (100), the first crystal axis is <100>, and the preferred stable wire direction is at least one selected from the group consisting of <011> and $<0\bar{1}1>$.

42. The process of claim 41 wherein the metal wire comprises at least one metal selected from the group consisting of gold, silicon, platinum and copper.

43. The process of claim 42 wherein the semiconductor material is silicon.

44. The process of claim 5 wherein the planar crystal structure orientation is (110), the first crystal axis is <110>, and the preferred stable wire direction is $<1\bar{1}0>$.

45. The process of claim 44 wherein the metal wire comprises at least one metal selected from the group consisting of gold, silicon, platinum and copper.

46. The process of claim 45 wherein the semiconductor material is silicon.

47. The process of claim 7 wherein the planar crystal structure orientation is (111), and the first crystal axis is <111>.

48. The process of claim 47 wherein the metal wire comprises at least one metal selected from the group consisting of gold, silicon, platinum and copper.

49. The process of claim 48 wherein the preferred stable wire direction is at least one selected from the group consisting of <01$\bar{1}$>, <1$\bar{0}\bar{1}$>, <1$\bar{1}$0>, <11$\bar{2}$>, <$\bar{2}$11> and <1$\bar{2}$1>.

50. The process of claim 48 wherein the semiconductor material is silicon.

51. The process of claim 49 wherein the semiconductor material is silicon.

52. The process of claim 7 wherein the planar crystal structure orientation is (100), the first crystal axis is <100>, and the preferred stable wire direction is at least one selected from the group consisting of <011> and <0$\bar{1}$1>.

53. The process of claim 52 wherein the metal wire comprises at least one metal selected from the group consisting of gold, silicon, platinum and copper.

54. The process of claim 53 wherein the semiconductor material is silicon.

55. The process of claim 7 wherein the planar crystal structure orientation is (110), the first crystal axis is <110>, and the preferred stable wire direction is <1$\bar{1}$0>.

56. The process of claim 55 wherein the metal wire comprises at least one metal selected from the group consisting of gold, silicon, platinum and copper.

57. The process of claim 56 wherein the semiconductor material is silicon.

* * * * *